US012088303B1

(12) United States Patent
Wang et al.

(10) Patent No.: US 12,088,303 B1
(45) Date of Patent: Sep. 10, 2024

(54) SELF-CALIBRATED PHASE TUNING SYSTEM

(71) Applicant: QUALCOMM Incorporated, San Diego, CA (US)

(72) Inventors: Lu Wang, Chapel Hill, NC (US); Yu Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 3 days.

(21) Appl. No.: 18/173,679

(22) Filed: Feb. 23, 2023

(51) Int. Cl.
G06F 1/06 (2006.01)
H03K 5/01 (2006.01)
H03K 5/00 (2006.01)

(52) U.S. Cl.
CPC ............... H03K 5/01 (2013.01); G06F 1/06 (2013.01); H03K 2005/00019 (2013.01); H03K 2005/00286 (2013.01)

(58) Field of Classification Search
None
See application file for complete search history.

(56) References Cited

U.S. PATENT DOCUMENTS

| 3,667,031 | A | 5/1972 | Cox, Jr. et al. |
| 4,308,619 | A | 12/1981 | Hughes |
| 5,425,074 | A | 6/1995 | Wong |
| 5,572,167 | A | 11/1996 | Alder et al. |
| 5,610,954 | A | 3/1997 | Miyashita et al. |
| 6,005,904 | A | 12/1999 | Knapp et al. |
| 6,389,095 | B1 | 5/2002 | Sun |
| 6,459,310 | B1 | 10/2002 | Thomson et al. |
| RE38,482 | E | 3/2004 | Leung et al. |
| 6,744,323 | B1 | 6/2004 | Moyal et al. |
| 6,822,491 | B1 | 11/2004 | Glass |
| 6,947,514 | B1 | 9/2005 | Kato et al. |
| 7,535,277 | B2 | 5/2009 | Suzuki |

(Continued)

FOREIGN PATENT DOCUMENTS

WO 0229973 A2 4/2002

OTHER PUBLICATIONS

Deka A.J., et al., "A 1Gbps-10 Gbps Multi-standard Auto-calibrated All Digital Phase Interpolator in 14nm CMOS", 2015 IEEE International Symposium on Circuits and Systems (ISCAS), IEEE, May 24, 2015, pp. 2209-2212, XP033183605, paragraph [000I] - paragraph [0III], figures 1-8.

(Continued)

Primary Examiner — Jeffrey S Zweizig
(74) Attorney, Agent, or Firm — Loza & Loza, LLP

(57) ABSTRACT

A clock generation apparatus has a delay circuit, a phase selection circuit, and a phase measurement circuit. The delay circuit outputs a first signal that is a delayed version of an input signal. The phase selection circuit receives the input signal and one or more phase-shifted versions of the input signal and outputs a second signal that is a phase-shifted version of the input signal. The phase measurement circuit compares the phases of the first signal and the second signal and provides a first output that controls phase of the second signal relative to the input signal. The phase measurement circuit also provides a second output that controls a delay applied by the delay circuit to the input signal to generate the first signal.

30 Claims, 9 Drawing Sheets

(56) References Cited

U.S. PATENT DOCUMENTS

| | | | |
|---|---|---|---|
| 8,259,888 B2 * | 9/2012 | Hua | H03L 7/07 455/208 |
| 8,368,434 B2 | 2/2013 | Tasic et al. | |
| 8,415,996 B1 | 4/2013 | Wong | |
| 8,508,308 B2 | 8/2013 | Dong et al. | |
| 8,536,915 B1 | 9/2013 | Terrovitis | |
| 8,923,375 B2 | 12/2014 | Qu et al. | |
| 9,208,130 B1 | 12/2015 | Chen et al. | |
| 10,014,868 B1 | 7/2018 | Raj | |
| 10,079,607 B1 | 9/2018 | Grens et al. | |
| 10,389,366 B2 | 8/2019 | Hailu et al. | |
| 10,972,108 B1 | 4/2021 | Li et al. | |
| 11,159,151 B1 * | 10/2021 | Lu | H04L 7/0025 |
| 2002/0043993 A1 | 4/2002 | Tam et al. | |
| 2006/0009180 A1 | 1/2006 | Xu et al. | |
| 2006/0133466 A1 | 6/2006 | Palmer et al. | |
| 2006/0220749 A1 | 10/2006 | Rosik et al. | |
| 2007/0047683 A1 | 3/2007 | Okamura et al. | |
| 2008/0205570 A1 | 8/2008 | Baumgartner et al. | |
| 2008/0297209 A1 | 12/2008 | Scuteri | |
| 2009/0278581 A1 | 11/2009 | Yang et al. | |
| 2009/0296867 A1 | 12/2009 | Do et al. | |
| 2011/0064176 A1 | 3/2011 | Takada | |
| 2012/0105110 A1 | 5/2012 | Kitayama et al. | |
| 2012/0139595 A1 | 6/2012 | Kamath et al. | |
| 2012/0194235 A1 | 8/2012 | Subburaj et al. | |
| 2012/0274372 A1 | 11/2012 | Nilsson et al. | |
| 2013/0003907 A1 | 1/2013 | Wenske | |
| 2013/0154698 A1 | 6/2013 | Bottelli et al. | |
| 2013/0214829 A1 | 8/2013 | Talwalkar et al. | |
| 2015/0198966 A1 | 7/2015 | Lee et al. | |
| 2015/0229298 A1 | 8/2015 | Tomita et al. | |
| 2015/0244381 A9 | 8/2015 | Choudhary et al. | |
| 2019/0123728 A1 | 4/2019 | Zhao et al. | |
| 2019/0293755 A1 | 9/2019 | Cohen et al. | |
| 2020/0021277 A1 | 1/2020 | Pi et al. | |
| 2020/0106429 A1 | 4/2020 | Doppalapudi et al. | |
| 2020/0321943 A1 | 10/2020 | Thijssen et al. | |

OTHER PUBLICATIONS

International Search Report and Written Opinion—PCT/US2024/010871—ISA/EPO—Jun. 4, 2024.

* cited by examiner

SELF-CALIBRATED PHASE TUNING SYSTEM

TECHNICAL FIELD

The present disclosure generally relates to clock recovery in high-speed interfaces and, more particularly, to automated calibration of phase interpolator circuits in a receiver.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components. For example, the high-speed bus interface may be implemented using a Peripheral Component Interconnect Express (PCIe) bus, Universal Serial Bus (USB) or Serial Advanced Technology Attachment (SATA), among others.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. A serializer-deserializer (SerDes) is used to transmit and receive from serial communication links. The SerDes typically uses multiple clock signals to perform its function. The SerDes may use, for example, two clock signals (in-phase clock and quadrature clock) that are separated by 90 degrees. SerDes performance can be degraded if these clock signals do not maintain the 90-degree phase shift. Phase mismatches between clock signals can increase bit-error-rate (BER) when the clock signals are used to sample data at a receive side. In one example, IC devices that include memory interfaces have physical layer circuits and that are configured to read and write double data rate random access memory devices rely on the integrity of the clock signals to achieve full data read/write rates. Increased demands for higher data rates require tight timing between circuits within the memory interface.

Performance, accuracy and/or reliability of data communication interfaces may depend on calibration and training procedures that can accommodate voltage drift and other variances that can impact the operation of high-speed data links. Therefore, there is an ongoing need for new techniques that provide reliable training and calibration techniques for components used to receive clock and data signals over high-speed data links.

SUMMARY

Certain aspects of the disclosure relate to systems, apparatus, methods and techniques that can be used in clock generation or recovery circuits in a receiver coupled to a data communication link. Certain aspects of the disclosure enable the phase relationships between clock signals to be managed or controlled by a self-calibrated phase tuning system. The clock signals may be used to capture data from high frequency, high data rate signals transmitted over the data communication link.

In various aspects of the disclosure, a clock generation apparatus has a delay circuit configured to output a first signal that is a delayed version of an input signal; a phase selection circuit configured to receive the input signal and one or more phase-shifted versions of the input signal and to output a second signal that is a phase-shifted version of the input signal; and a phase measurement circuit coupled to the first signal and the second signal, the phase measurement circuit providing a first output that is coupled to a phase control input of the phase selection circuit, the phase measurement circuit further providing a second output that is coupled to a delay control input of the delay circuit.

In various aspects of the disclosure, an apparatus includes means for delaying an input signal to provide a first signal that is a delayed version of the input signal; means for phase-shifting the input signal, configured to provide a second signal that is a phase-shifted version of the input signal, the means for phase-shifting the input signal being further configured to receive the input signal and one or more phase-shifted versions of the input signal and to output a second signal that is a phase-shifted version of the input signal; and means for measuring phase differences between signals, configured to provide a first output that is provided to the means for phase-shifting the input signal and configured to control phase of the second signal relative to the input signal, and to provide a second output that controls a delay applied by the means for delaying the input signal to the input signal when generating the first signal.

In various aspects of the disclosure, a method for tuning phase in a clock generation apparatus includes: configuring a delay circuit to output a first signal that is a delayed version of an input signal; configuring a phase selection circuit to receive the input signal and one or more phase-shifted versions of the input signal and to output a second signal that is a phase-shifted version of the input signal; configuring a phase measurement circuit coupled to the first signal and the second signal to provide a first output to the phase selection circuit, the first output being configured to control phase of the second signal relative to the input signal; and configuring the phase measurement circuit to provide a second output to the delay circuit, the second output being configured to control a delay applied by the delay circuit to the input signal when generating the first signal.

In certain aspects, the phase measurement circuit is configured to measure a phase difference between the first signal and the second signal. The phase selection circuit may include a phase interpolator circuit or a phase mixer circuit. The second signal may be generated as a weighted combination of the input signal and the one or more phase-shifted versions of the input signal. The first output provided by the phase measurement circuit is configured to adjust weights applied to the input signal and the one or more phase-shifted versions of the input signal. The second output provided by the phase measurement circuit may be configured to decrease the delay applied by the delay circuit to the first signal when the phase difference measured between the first signal and the second signal is less than a nominal phase difference. The second output provided by the phase measurement circuit may be configured to increase the delay applied by the delay circuit to the first signal when the phase difference measured between the first signal and the second signal exceeds the nominal phase difference. In some examples, the nominal phase difference corresponds to a 90-degree phase shift. In other examples, the nominal phase difference is defined based on the structure of an eye opening in a plot of a data signal transmitted over the data communication link.

In one aspect, the phase measurement circuit is configured to modify its second output responsive to changes in a phase difference between the first signal and the second signal. In one aspect, the delay circuit is further configured to output a complement of the first signal, and the phase selection circuit is further configured to output a complement of the second signal.

DETAILED DESCRIPTION

Figure 1:
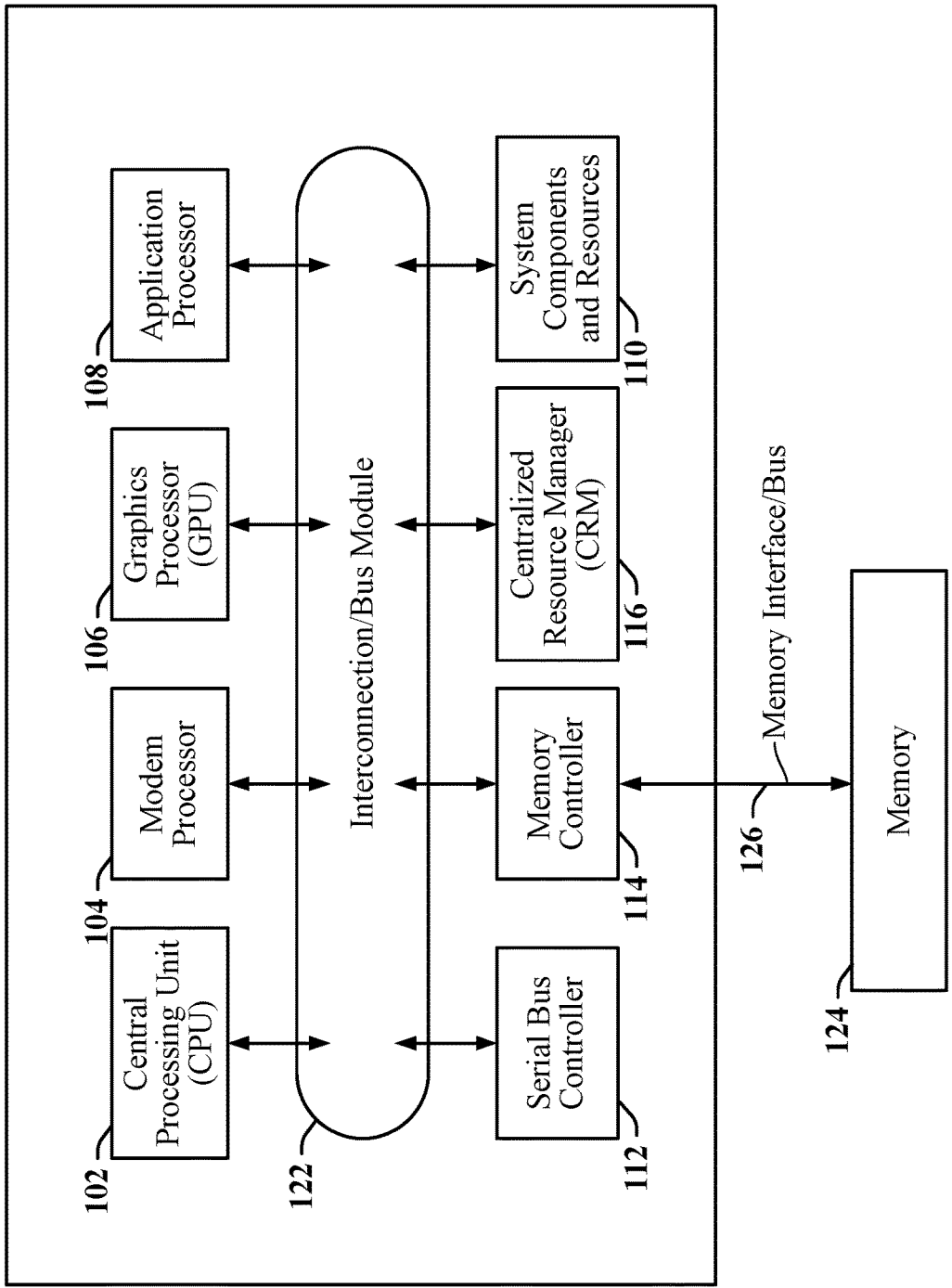
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Certain aspects of this disclosure relate to a self-calibrated phase tuning circuit that can maintain optimal phase shifts between in-phase and quadrature-phase clock signals. In one implementation, an in-phase clock signal is provided as the sampling clock signal and a quadrature-phase clock signal is synchronized with edges in a data signal. In another implementation, the in-phase clock signal is synchronized with edges in a data signal and the quadrature-phase clock signal is provided as the sampling clock signal. In some examples, the quadrature-phase clock signal may be phase-shifted by 90° with respect to the in-phase clock signal. The self-calibrated phase tuning circuit can maintain the optimal phase between an edge clock signal that is synchronized with the edges in the data signal and the sampling clock signal for all process, voltage, and temperature (PVT) corners. In some implementations, a complement of the in-phase clock signal is provided as a signal that is 180° phase shifted with respect to the in-phase clock signal. A complement of the quadrature-phase clock signal may be provided as a signal that is 180° phase shifted with respect to the quadrature-phase.

FIG. 1 illustrates example components and interconnections in a system-on-chip (SoC) 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Figure 2:
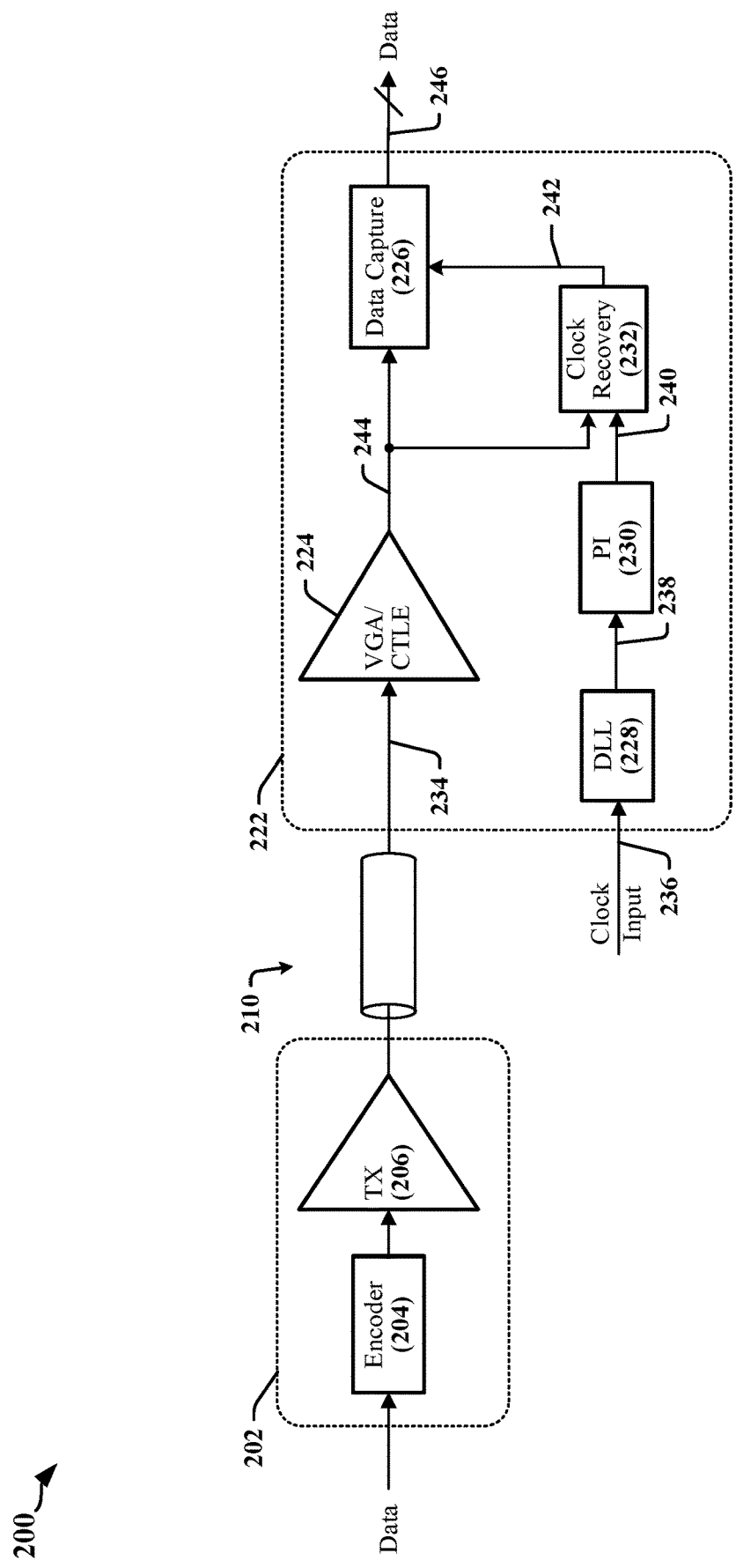
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which a transmitted data signal propagates from the first device to the second device. The receiver 222 is provided in the second device and may be configured to receive and process a received data signal 234.

In one example, the transmitter 202 includes a serializer 204 configured to provide a stream of data for transmission through the data communication channel 210. The transmitter 202 further includes a transmit driver 206 configured to generate the transmitted data signal based on the serial data for transmission to the receiver 222 over the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc.

The receiver 222 includes a variable gain amplifier (VGA) with a continuous time linear equalizer (CTLE) (the VGA/CTLE 224), which may be implemented in a single stage or multiple stages, a clock data recovery circuit (the CDR circuit 232), and a deserializer 226. CTLE may refer to techniques for boosting the higher frequency components of the signal at the receiver in order to bring all frequency components of the signal to a similar amplitude, improving jitter and eye-diagram performance. As disclosed herein, the VGA/CTLE 224 is configured to perform equalization and amplification of the received data signal 234. The CDR circuit 232 is configured to recover clock information associated with the data signal 234 and to generate a data recovery clock signal 242 that can be used to sample or otherwise recover the serial data from the amplified data signal 244. The deserializer 226 is configured to convert a serial data stream back into parallel data 246.

The received data signal 234 or a received clock signal may be distorted when it arrives at the receiver 222 through the data communication channel 210. Distortion may arise for various reasons including impedance mismatches in the data communication channel 210, interference and reflected energy. Signal distortion can make it difficult to recover the clock information and the data by the CDR circuit 232 and can limit the window of stability during which data can be reliably sampled from the amplified data signal 244. In some examples, distortion in the received data signal 234 caused by high frequency attenuation can be addressed by the VGA/CTLE 224, which may be configured to perform equalization and amplification that increases the high frequency components of the data signal 234 in order to increase the data rate at which the data may be sent through the data communication channel 210 and reliably recovered at the receiver 222. In some examples, amplification may be performed using high-speed amplifiers that are implemented using current-mode logic (CML) structures. CML structures may also be referred to as source-coupled logic (SCL) structures.

The CDR circuit 232 may be configured to generate a data recovery clock signal 242 that has edges (transitions) that are positioned in time within the window of stability during which data can be reliably sampled. The data recovery clock signal 242 may be provided in two or more phase versions that can be used directly by a data recovery circuit, including the illustrated deserializer 226. In the illustrated example, a clock input 236 is provided to a delay locked loop (the DLL 228) that provides a receiver clock signal 238. In some examples, the receiver clock signal 238 is provided as multiple phase single-ended signals, although it may alternatively be provided as multiple phase differential signals. The receiver clock signal 238 can be used to derive the data recovery clock signal 242. In one example, the clock input 236 is a version of a clock signal received from the transmitter 202. The DLL 228 may be configured to generate the receiver clock signal 238 with a different frequency than the frequency associated with the clock input 236. For example, the DLL 228 may be configured to double or quadruple the frequency associated with the clock input 236 while preserving correspondence of edges in the clock input 236 with edges in the receiver clock signal 238. In some implementations, a phase interpolator (the PI 230) may be used to generate one or more phase shifted receiver clock signals 240 that are used by the CDR circuit 232. The PI 230 may be configurable to move or reposition edges in the data recovery clock signal 242 within the window of stability to accommodate changes in operating conditions that may be sensitive to the effects of process, voltage and temperature (PVT) variances.

Certain aspects of the disclosure are applicable to phase tuning in a clock and data recovery (CDR) circuit that includes a serializer-deserializer (SerDes). In high-speed interfaces, the CDR circuit may provide the SerDes with oversampling clock signals that include an in-phase clock signal and a quadrature-phase clock signal that have a nominal phase difference of 90 degrees. In one example, the oversampling clock signals are double rate signals, which switch at twice the frequency of the clock signal used to control transmission over the communication link. One of the clock signals is typically aligned with an edge of a bit transmission interval in a received data signal while the other clock signal is used to sample the data signal in the middle of the bit transmission interval. Phase mismatches or skews can occur between the in-phase and quadrature clock signals. For the purposes of this disclosure, skew denotes a deviation from the nominal ninety-degree phase difference between the in-phase and quadrature clock signals. Unless corrected, skew can result in excess jitter at the receiver side of the SerDes and reduce the time interval (window of stability) during which data can be reliably sampled. In addition to jitter resulting from skew between the clock signals, the window of stability may be affected by inter-symbol interference (ISI) jitter, phase locked loop (PLL) jitter, and other sources of delay or interference. The presence or expectation of jitter can degrade the bit error rate (BER).

Figure 3:
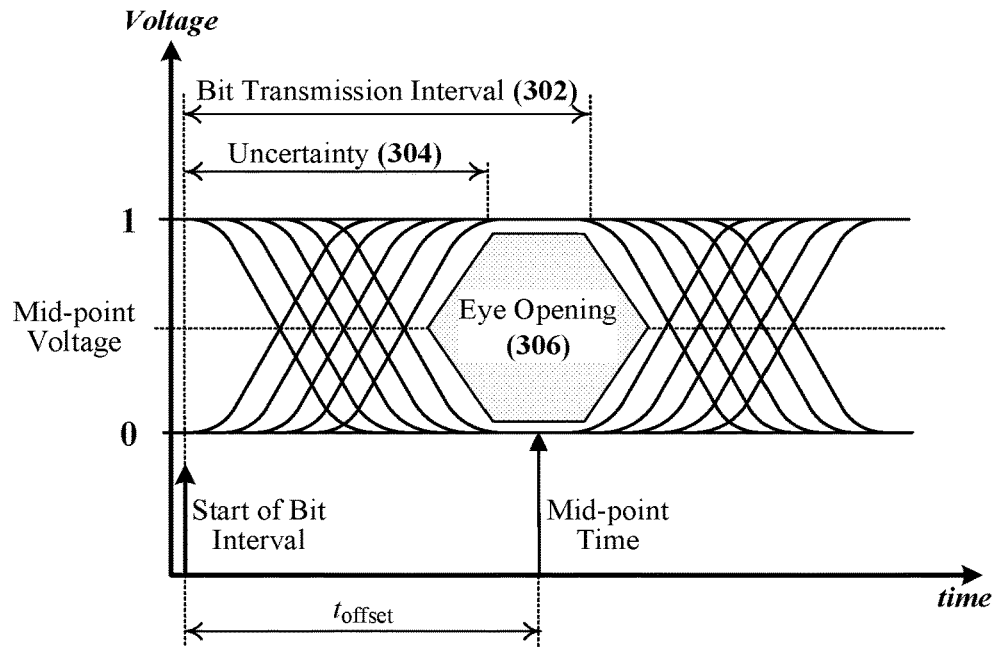
FIG. 3 illustrates an eye diagram generated as an overlay of signaling state for multiple bit transmissions.
Figure 3:
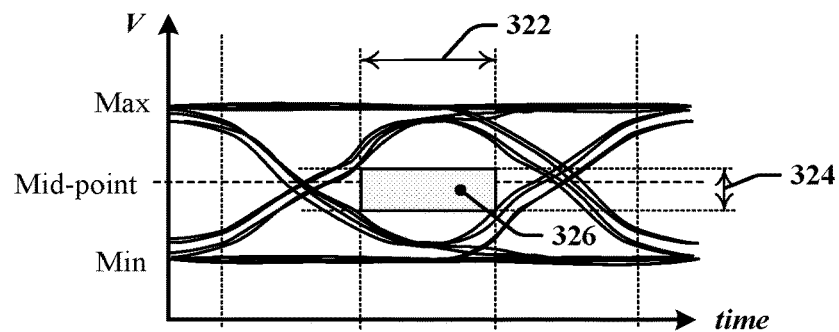

The window of stability during which data can be reliably sampled may be visualized in an eye-diagram. FIG. 3 illustrates one example of an eye diagram 300 generated as an overlay of signaling state for multiple bit transmissions. A bit transmission may occur in one bit transmission interval 302 that can span a full cycle or half-cycle of a transmitter clock signal. A signal transition region 304 represents a time period of uncertainty at the boundary between two symbols where variable signal rise times prevent reliable decoding. State information may be determined reliably in a region defined by an eye opening 306 that encompasses the window of stability, and that represents the period of period in which signaling state is stable and the bit value can be reliably sampled and captured. The eye opening 306 may define a region in which signal mid-point crossings do not occur. A receiver or decoder can delineate a window of stability within the eye opening 306 in which the signaling states can be reliably distinguished and in which information can be reliably sampled, demodulated or decoded from a data signal. The window of stability may be determined based on minimum and maximum voltage thresholds. The eye opening 306 may be narrowed along the time axis by increases in data rate and may be compressed in the voltage axis as a result of ISI and other types of interference and distortion. The eye opening 306 may be narrowed along the time axis when rise times or fall times for a data signal differ.

The concept of periodic sampling and overlaid display of the signal is useful during design, adaptation and configuration of systems which use a clock and data recovery (CDR) circuit that re-creates the received data-timing signal using frequent transitions appearing in the received data. The eye opening 306 in an eye diagram 300 observed, simulated or computed for a CDR that includes a SerDes can be utilized as a basis for judging the ability to reliably recover data.

FIG. 3 also provides an example of an eye-diagram 320 that shows the combined effect of distortion and jitter on a data signal received from a high-speed serial data channel. In the illustrated example, a tradeoff between the height 324 and width 322 of the eye opening 326 may be needed to provide an adequate duration of time in which transitions can be reliably detected. Reductions in height 324 of the eye opening 326 may be obtained by moving detection thresholds of the transitions of the received data signal to provide sufficient duration of time in which the data signal can be sampled. The width 322 of the eye opening 326 is determined in part by the variability in phase shift between in-phase and quadrature-phase clock signals. Increasing precision of the phase shift between in-phase and quadrature-phase clock signals can enable operation with an eye opening 326 with narrower width 322 and a correspondingly greater height 324.

Figure 4:
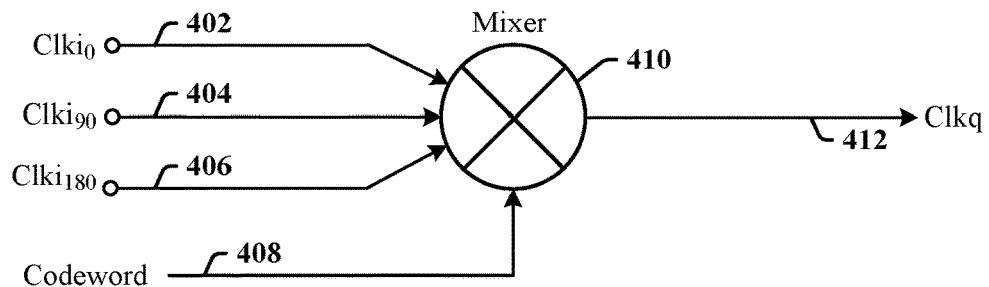
FIG. 4 illustrates an example of a phase shifting circuit that may be adapted in accordance with certain aspects of the present disclosure.
Figure 4:
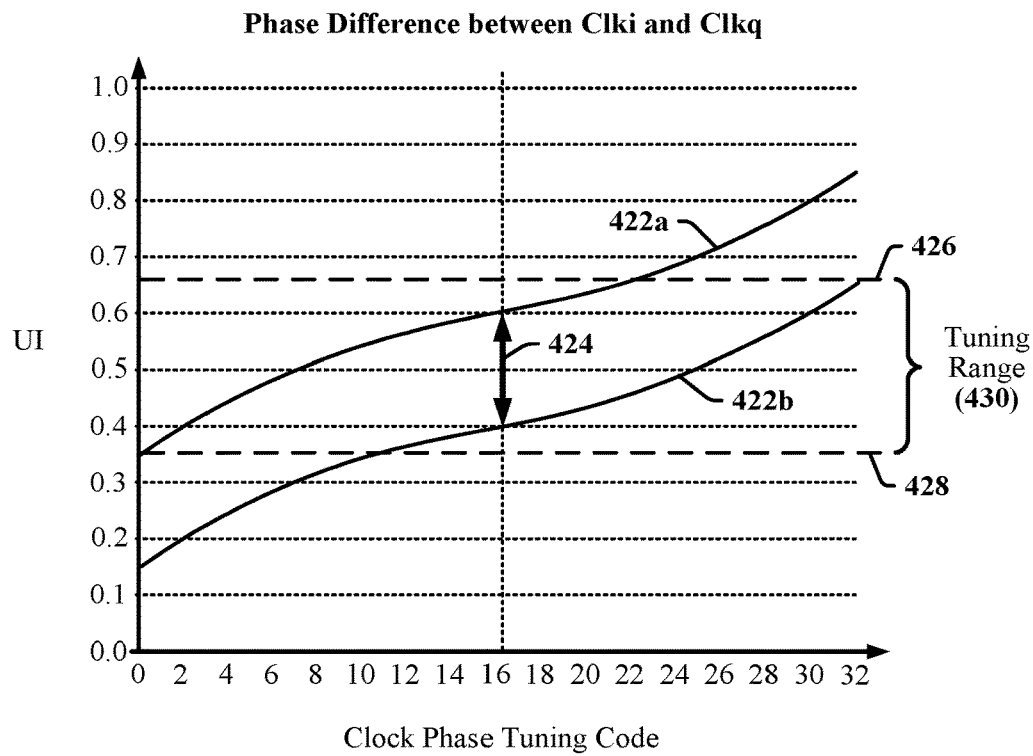

FIG. 4 illustrates an example of a phase shifting circuit 400 that may be adapted for use in systems configured in accordance with certain aspects of this disclosure. The phase shifting circuit 400 includes a phase mixing circuit 410 that may be used to generate in-phase and quadrature-phase clock signals. The phase mixing circuit 410 may be implemented using analog devices, digital devices or a combination of analog and digital devices. The phase mixing circuit 410 may be configured using a codeword 408 that selects a phase shift between an input signal (the Clki$_0$ signal 402) and an output signal (the Clkq signal 412). The codeword 408 may be configured during system design, integration, initialization or during a calibration procedure. In some instances, the calibration procedure may include measuring the phase shift between the $Clki_0$ signal 402 and the Clkq signal 412, and adjusting the codeword 408 when the measured phase shift varies or deviates from a nominal or desired phase shift.

The phase mixing circuit 410 receives the $Clki_0$ signal 402 and two phase shifted version of the $Clki_0$ signal 402. In the illustrated example, the $Clki_{90}$ signal 404 is phase shifted by 90° with respect to the $Clki_0$ signal 402 and the $Clki_{180}$ signal 406 is phase shifted by 180° with respect to the $Clki_0$ signal 402. The Clkq signal 412 may be generated as a weighted summation of the $Clki_0$ signal 402, the $Clki_{90}$ signal 404 and the $Clki_{180}$ signal 406. The codeword 408 defines the weights applied to the $Clki_0$ signal 402, the $Clki_{90}$ signal 404 and the $Clki_{180}$ signal 406.

Figure 5:
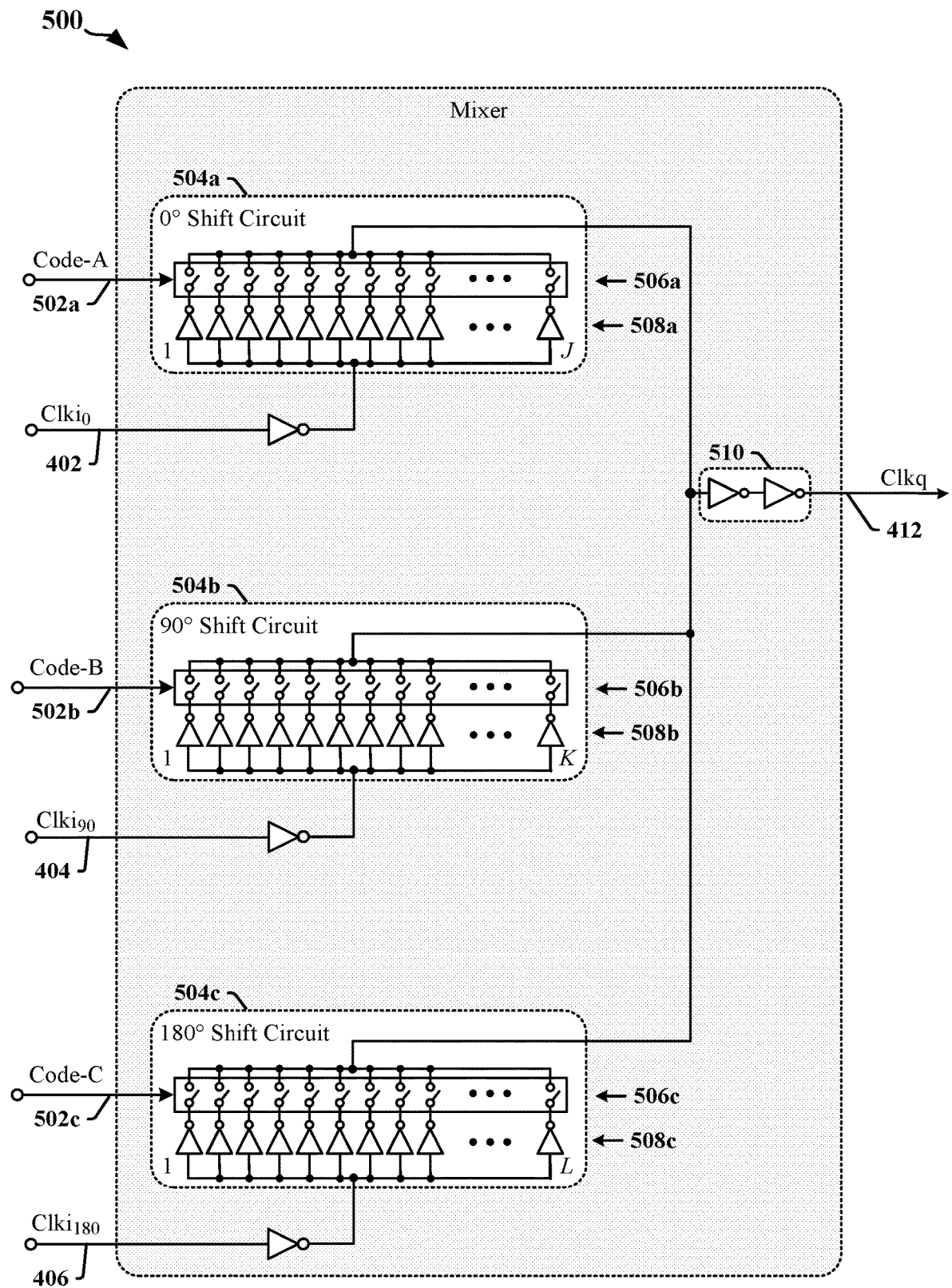
FIG. 5 illustrates an example of a phase interpolator circuit that may be configured or adapted in accordance with certain aspects of the present disclosure.

FIG. 5 illustrates one example of a phase interpolator circuit 500 that can be used to implement the phase mixing circuit 410 illustrated in FIG. 4. The illustrated phase interpolator circuit 500 can rotate phase of an input clock signal in accordance with certain aspects of this disclosure. The codeword 408 may be used to control the phase shift applied by the phase interpolator circuit 500. The phase interpolator circuit 500 receives three phase shifted versions of an input clock signal, including a zero-phase shifted input signal 402, a 90° phase shifted input signal 404 and a 180° phase shifted input signal 406. The phase interpolator circuit 500 combines the phase shifted input signals 402, 404, 406 to provide a Clkq signal 412 that has a phase shift determined by the codeword 408. The codeword 408 can have any desired length.

In the illustrated example, the codeword 408 may be used to generate multibit control signals 502a, 502b and 502c that configure phase shift circuits 504a, 504b, 504c. The outputs of the phase shift circuits 504a, 504b, 504c contribute to the total phase shift applied by the phase interpolator circuit 500. The $Clki_0$ signal 402 is provided to a 0° shift circuit 504a, the $Clki_{90}$ signal 404 is provided to a 90° shift circuit 504b and the $Clki_{180}$ signal 406 is provided to a 180° shift circuit 504c. A number (J) of driving circuits 508a in the 0° shift circuit 504a are configured to be coupled in parallel to the Clkq signal 412 when corresponding switches in a set of switches 506a are closed in accordance with the configuration of the first code 502a. A number (K) of driving circuits 508b in the 90° shift circuit 504b are configured to be coupled in parallel to the Clkq signal 412 when corresponding switches in a set of switches 506b are closed in accordance with the configuration of the second multibit control signal 502b. A number (L) of driving circuits 508c in the 180° shift circuit 504c are configured to be coupled in parallel to the Clkq signal 412 when corresponding switches in a set of switches 506c are closed in accordance with the configuration of the third multibit control signal 502c.

In one example, the codeword 408 may include 12 bits that are allocated evenly among the multibit control signals 502a, 502b and 502c and the phase shift circuits 504a, 504b, 504c include equal numbers of driving circuits 508a, 508b, 508c and equal numbers of switches in the corresponding sets of switches 506a, 506b, 506c. In this example, J=K=L≤16. A first multibit control signal 502a (Code-A) controls the weight applied to the $Clki_0$ signal 402, a second multibit control signal 502b (Code-B) controls the weight applied to the $Clki_{90}$ signal 404 and a third multibit control signal 502c (Code-C) controls the weight applied to the $Clki_{180}$ signal 406. In other examples, the codeword 408 can include a different number of bits, and/or the multibit control signals 502a, 502b and 502c can have different lengths. For example, multibit control signals 502a and 502c may each have 4-bit length while multibit control signal 502b has a 5-bit length such that J=L≤ 16 and K≤32. In this latter example, the phase shift resolution is increased within the 90° shift circuit 504b with respect to the phase shift resolution provided by the 0° shift circuit 504a and the 180° shift circuit 504c. In other examples, variable codeword bit allocation can enable tradeoffs to be made between phase tuning range and phase resolution of the phase interpolator circuit 500. For example, the codeword 408 bit allocation may be defined to increase phase shift resolution (smaller step size) while reducing the phase tuning range, and vice versa.

The codeword 408 indicates the number of switches to be closed in each set of switches 506a, 506b, 506c. In some implementations, the switches in each set of switches 506a, 506b, 506c may be indexed such that the corresponding multibit control signal 502a, 502b or 502c identifies the highest numbered switch (i.e., the Nth switch) to be closed such that all switches in the set of switches 506a, 506b or 506c are closed. Each of the driving circuits 508a coupled to a closed switch in the set of switches 506a pulls the phase of the Clkq signal 412 toward the phase of the $Clki_0$ signal 402. Each of the driving circuits 508b that is coupled through a closed switch in the set of switches 506b pulls the phase of the Clkq signal 412 toward the phase of the $Clki_{90}$ signal 404. Each of the driving circuits 508c that is coupled through a closed switch in the set of switches 506c pulls the phase of the Clkq signal 412 toward the phase of the $Clki_{180}$ signal 406. Accordingly, the phase of the Clkq signal 412 is determined based on the number of closed switches in each set of switches 506a, 506b, 506c. One or more buffers 510 may be used to drive the Clkq signal 412 and to ensure a constant output impedance, for example. The output signal may be provided in multiple phases, including in-phase and quadrature-phase signals.

Referring again to FIG. 4, a graph 420 is provided that shows the effect of variances in PVT conditions on the phase difference between the $Clki_0$ signal 402 and the Clkq signal 412 for a variety of values of the codeword 408. In the illustrated example, phase shift is expressed as a fraction of a unit interval (UI) in which a bit of data is encoded in the waveform of a received data signal. In this example, the data signal may be a double data rate signal in which each two bits of data are transmitted for each cycle of a transmitted clock signal. Two curves 422a and 422b plot the phase shift obtained for different values of the codeword 408. The curves 422a and 422b may delineate the maximum and minimum phase variations attributable to changes in PVT conditions. In the illustrated example, the maximum phase difference 424 obtained for the same codeword value under varying PVT conditions is 36° (0.2 UI). PVT variance can limit the tuning range 430 of the phase shifting circuit 400. The tuning range 430 is determined by a minimum phase shift 426 that can be achieved for the first curve 422a and a maximum phase shift 428 that can be achieved for the second curve 422b. Within the tuning range 430, all values of phase shift between the minimum phase shift 426 and the maximum phase shift 428 can be obtained under all PVT values.

A self-calibrated phase tuning system configured or adapted in accordance with certain aspects of this disclosure can optimize the phase alignment of in-phase and quadrature-phase clock signals and optimize data sampling in a clock and data recovery circuit. The in-phase and quadrature-phase clock signals may have a phase alignment based on edges in a received data signal and may provide a sampling edge that is optimally maintained within an eye-opening under all PVT conditions. In one aspect, performance of a phase tuning circuit is improved with respect to conventional systems.

Figure 6:
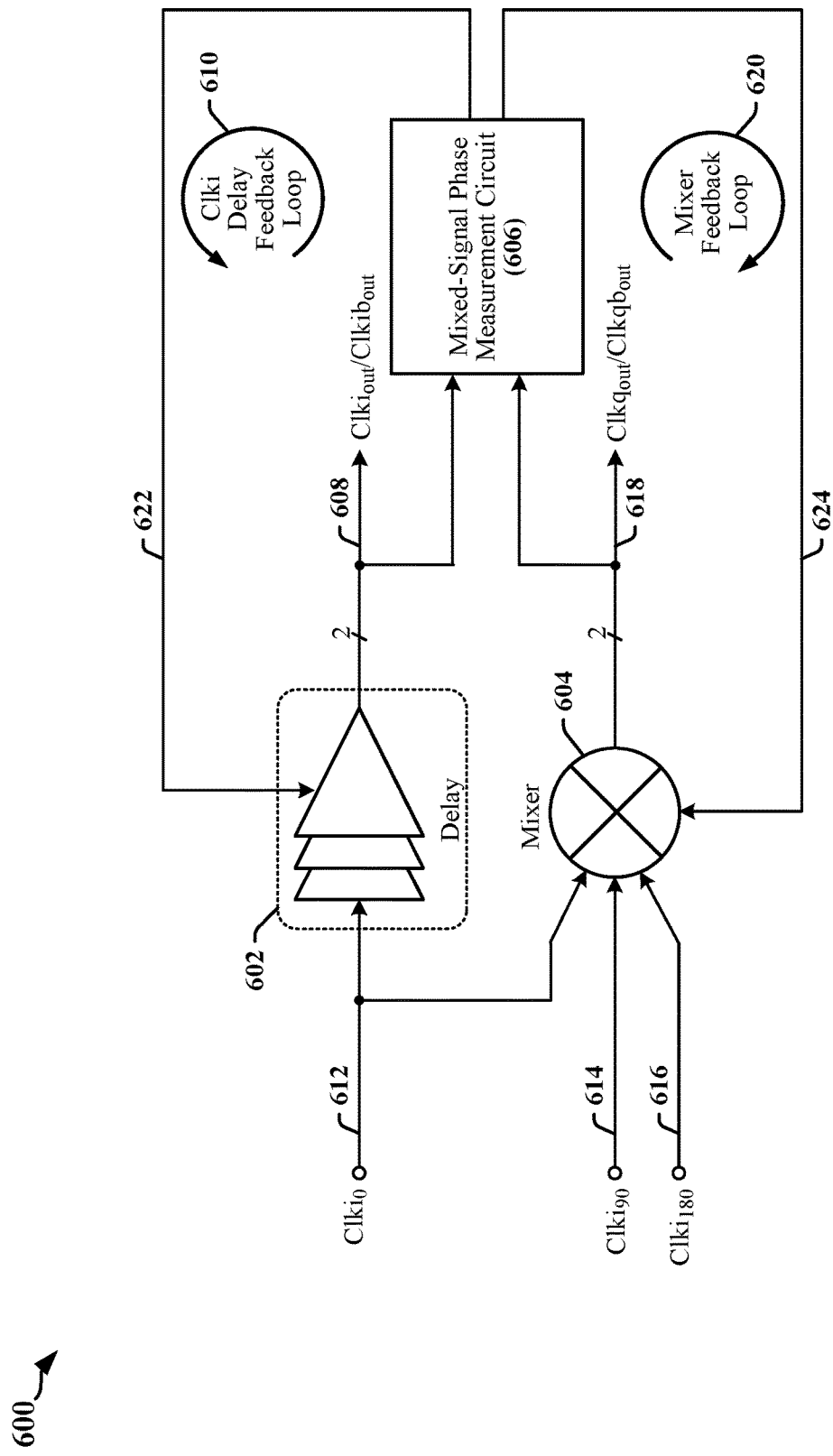
FIG. 6 illustrates a self-calibrated phase tuning system is configured in accordance with certain aspects of this disclosure.

FIG. 6 illustrates a self-calibrated phase tuning system 600 configured in accordance with certain aspects of this disclosure. The self-calibrated phase tuning system 600 includes two feedback loops 610, 620. A first feedback loop 620 can be used to control the phase shift of a quadrature-phase signal generated by a phase mixing circuit 604 and a second feedback loop 610 can fine tune the phase shift between the quadrature-phase signal and an output in-phase signal by controlling a delay applied to an input in-phase signal by a delay circuit that provides the output in-phase signal.

In the illustrated example, the self-calibrated phase tuning system 600 includes a phase mixing circuit 604 that can be used to maintain a desired or nominal phase relationship between in-phase and quadrature-phase clock signals. The phase mixing circuit 604 may be implemented using analog devices, digital devices or a combination of analog and digital devices. In some implementations, the phase mixing circuit 604 may be implemented using the phase interpolator circuit 500 illustrated in FIG. 5. The phase mixing circuit 604 may be configured using a mixer feedback signal 624 that selects or adjusts a phase shift between an input signal (the $Clki_0$ signal 612) and a quadrature-phase output signal (the $Clkq_{out}/Clkqb_{out}$ signal 618). In some implementations, the mixer feedback signal 624 may configure or modify a codeword used to select the phase shift provided by the phase mixing circuit 604. In some implementations, the mixer feedback signal 624 may adjust the phase shift provided by the phase mixing circuit 604 by other means, including by modifying one or more biasing currents, for example.

The phase mixing circuit 604 receives the $Clki_0$ signal 612 and two phase shifted version of the $Clki_0$ signal 612. In the illustrated example, the $Clki_{90}$ signal 614 is phase shifted by 90° with respect to the $Clki_0$ signal 612 and the $Clki_{180}$ signal 616 is phase shifted by 180° with respect to the $Clki_0$ signal 612. The $Clkq_{out}/Clkqb_{out}$ signal 618 may be generated as a weighted summation of the $Clki_0$ signal 612, the $Clki_{90}$ signal 614 and the $Clki_{180}$ signal 616. The mixer feedback signal 624 defines the weights applied to the $Clki_0$ signal 612, the $Clki_{90}$ signal 614 and the $Clki_{180}$ signal 616. The phase mixing circuit 604 can produce the $Clkq_{out}/Clkqb_{out}$ signal 618 with a phase shift that lies within a 0°-180° range.

The phase mixing circuit 604 may be configured during system design, integration, initialization or during an initial calibration procedure. The phase shift provided by the phase mixing circuit 604 may be adjusted continuously or continually during operation. In the illustrated example, the mixer feedback signal 624 is provided by a phase measurement circuit 606 that is configured to accurately measure the phase difference between an in-phase output signal (the $Clki_{out}/Clkib_{out}$ signal 608) and the $Clkq_{out}/Clkqb_{out}$ signal 618. The $Clki_{out}/Clkib_{out}$ signal 608 is a delayed version of the $Clki_0$ signal 612 that is produced by a programmable delay circuit 602. The delay introduced by the programmable delay circuit 602 is determined by a delay feedback signal 622 provided by the phase measurement circuit 606. The programmable delay circuit 602 can expand the tuning range of the self-calibrated phase tuning system 600 and can provide fine control over the phase difference between the $Clki_{out}/Clkib_{out}$ signal 608 and the $Clkq_{out}/Clkqb_{out}$ signal 618.

Figure 7:
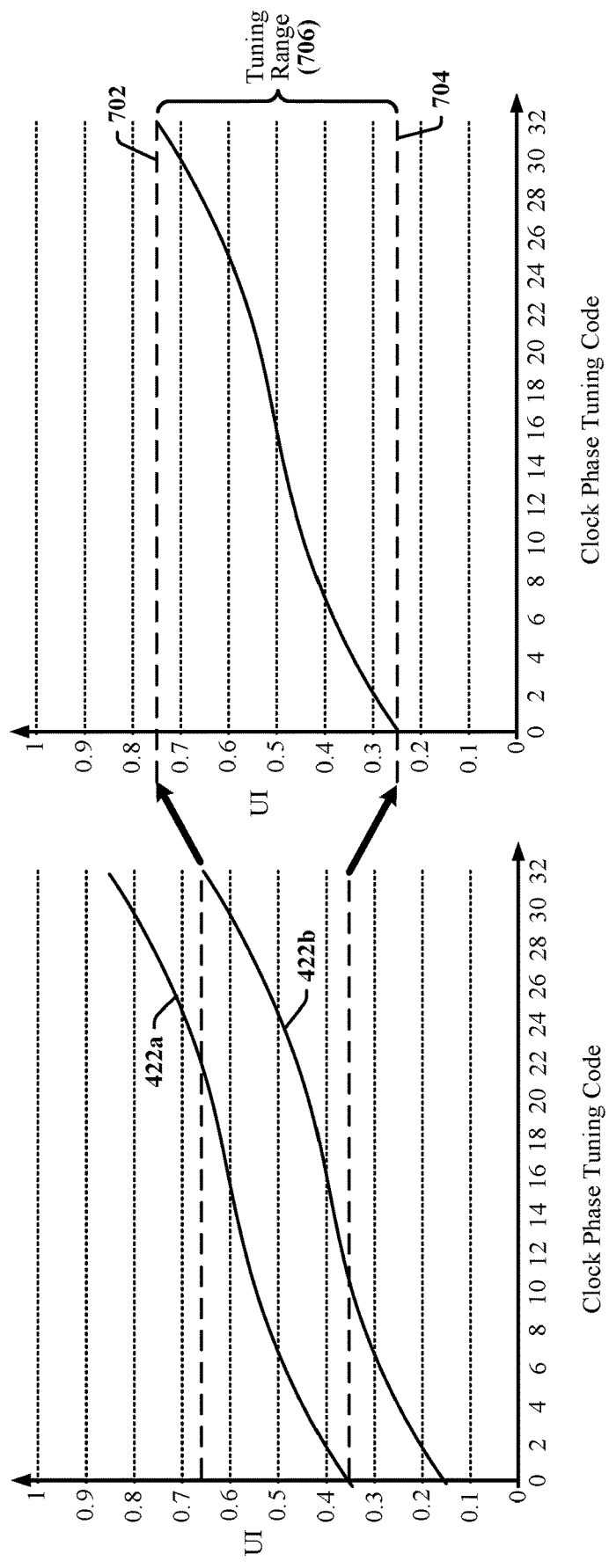
FIG. 7 illustrates an example of an expanded tuning range that may be achieved using the self-calibrated phase tuning system illustrated in FIG. 6.

FIG. 7 includes a graph 700 that illustrates the tuning range 706 of the self-calibrated phase tuning system 600. The graph 420 provided in FIG. 4 is reproduced in FIG. 7 to facilitate comparison. The graph 420 shows the effect of variances in PVT conditions on the phase difference between the $Clki_0$ signal 402 and the $Clkq$ signal 412 for the phase shifting circuit 400 illustrated in FIG. 4. The combination of the phase measurement circuit 606 with the phase mixing circuit 604 and the programmable delay circuit 602 provides a broader tuning range 706 for the self-calibrated phase tuning system 600. The phase measurement circuit 606 detects variations in phase differences from nominal values when, for example, PVT conditions change. The phase measurement circuit 606 or associated control circuit can modify the mixer feedback signal 624 and/or the delay feedback signal 622 to adjust the phase difference between the $Clki_{out}/Clkib_{out}$ signal 608 and the $Clkq_{out}/Clkqb_{out}$ signal 618. In certain example, the control circuit associated phase measurement circuit 606 may include a microcontroller, finite state machine, combinational logic or the like.

In certain examples, the programmable delay circuit 602 may be configured to counteract variations in the phase difference between the $Clki_{out}/Clkib_{out}$ signal 608 and the $Clkq_{out}/Clkqb_{out}$ signal 618 that are attributable to PVT variances. In these examples, the value of the codeword configured for the phase mixing circuit 604 may remain unchanged while the programmable delay circuit 602 increases or decreases the delay applied to the $Clki_0$ signal 612 to obtain the $Clki_{out}/Clkib_{out}$ signal 608. Accordingly, a calibrated codeword need not be changed due to PVT variations. In some instances, the programmable delay circuit 602 may be unable to accommodate larger changes in phase difference and the phase measurement circuit 606 or associated control circuit may cause the codeword to be modified.

The tuning range 706 can be increased with respect to the tuning range 430 in the example provided in FIG. 4 through the use of the phase measurement circuit 606 and the operation of the feedback loops 610, 620, which increase the maximum phase shift 702 and lower the minimum phase shift 704 that can be achieved under all PVT values.

According to certain aspects of this disclosure, the programmable delay circuit 602 can enable fine control over the phase difference between the $Clki_{out}/Clkib_{out}$ signal 608 and the $Clkq_{out}/Clkqb_{out}$ signal 618. In one example, fine control over the phase difference between the $Clki_{out}/Clkib_{out}$ signal 608 and the $Clkq_{out}/Clkqb_{out}$ signal 618 may be exercised to linearize phase shifts over all values of the codeword that configures the phase mixing circuit 604. Phase mixing circuits of all types, including phase interpolators, can exhibit non-linearity in the phase shift produced for a range of evenly-spaced codewords or control settings used to configure the desired phase. In the example of a phase interpolator, linearity can be measured in terms of both the Integral Non-Linearity (INL) and Differential Non-Linearity (DNL). INL may refer to the deviation of each point in a code space from the ideal value for the corresponding code. DNL may refer to the deviation of the amplitude of each step relative to the ideal step, or relative to the amplitude associated with the least significant bit (LSB) in the codeword.

Figure 8:
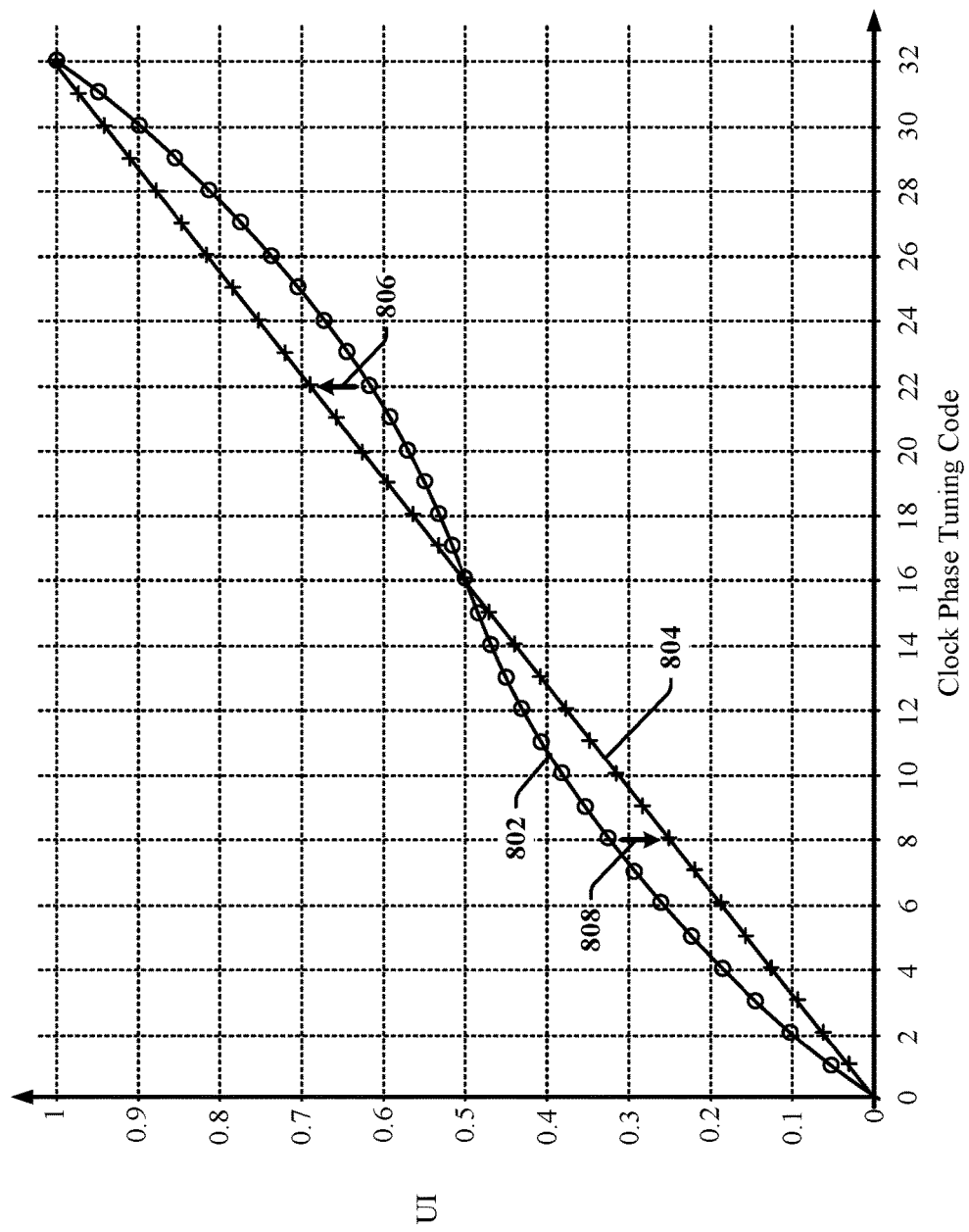
FIG. 8 illustrates an example of fine tuning using the a self-calibrated phase tuning system illustrated in FIG. 6.

FIG. 8 includes a graph 800 that illustrates an example of the relationship between phase difference and codeword value that is applicable to most, if not all, types of phase mixing circuits. In the illustrated example, the phase difference curve 802 simulated or observed for the phase mixing circuit 604 represents the difference between the in-phase input signal (the Clki$_0$ signal 612) and the quadrature-phase output signal (the Clkq$_{out}$/Clkqb$_{out}$ signal 618) produced by the phase mixing circuit 604 in the self-calibrated phase tuning system 600 illustrated in FIG. 6. The simulated or observed phase difference curve 802 is non-linear and deviates from the ideal or desired phase difference curve 804. The ideal or desired phase difference curve 804 characterizes a response that is linear while the simulated or observed phase difference curve 802 response is non-linear due to DNL effects, for example. The self-calibrated phase tuning system 600 illustrated in FIG. 6 includes a second feedback loop 610 that can be configured to counteract DNL effects and other contributors to the non-linearity of the simulated or observed phase difference curve 802. The second feedback loop 610 responds to the phase measurement circuit 606 and controls a programmable delay circuit 602 that can modify the phase of the output in-phase signal (the Clki$_{out}$/Clkib$_{out}$ signal 608) with respect to the in-phase input signal (the Clki$_0$ signal 612). The phase measurement circuit 606 can accurately measure the phase difference between the Clki$_{out}$/Clkib$_{out}$ signal 608 and the Clkq$_{out}$/Clkqb$_{out}$ signal 618. The phase measurement circuit 606 or an associated control circuit can automatically modify, configure or program the delay circuit to accommodate or counteract the effects of changes in PVT conditions, for example.

The programmable delay circuit 602 can be configured to automatically linearize the simulated or observed phase difference curve 802. For each codeword value, the programmable delay circuit 602 may be configured to increase or decrease the phase shift by adjusting the delay provided by the phase difference between the Clki$_{out}$/Clkib$_{out}$ signal 608 and the Clkq$_{out}$/Clkqb$_{out}$ signal 618 to obtain the nominal phase difference expected for the codeword value.

In an example where the phase mixing circuit 604 produces an insufficient phase shift, the programmable delay circuit 602 may be configured to provide an increased phase shift 806 by decreasing the delay between the Clki$_0$ signal 612 and the Clki$_{out}$/Clkib$_{out}$ signal 608. In an example where the phase mixing circuit 604 produces an excessive phase shift, the programmable delay circuit 602 may be configured to provide a reduced phase shift 808 by increasing the delay between the Clki$_0$ signal 612 and the Clki$_{out}$/Clkib$_{out}$ signal 608.

According to certain aspects of this disclosure, a clock generation apparatus has a delay circuit, a phase selection circuit, and a phase measurement circuit. The delay circuit is configured to output a first signal that is a delayed version of an input signal. The phase selection circuit is configured to receive the input signal and one or more phase-shifted versions of the input signal and to output a second signal that is a phase-shifted version of the input signal. The phase measurement circuit is coupled to the first signal and the second signal. The phase measurement circuit may provide a first output that is coupled to a phase control input of the phase selection circuit. The phase measurement circuit may further provide a second output that is coupled to an input of the delay circuit that controls the delay applied by the delay circuit to the input signal to generate the first signal.

In certain examples, the phase measurement circuit is configured to measure a phase difference between the first signal and the second signal. The phase selection circuit may include a phase interpolator circuit or a phase mixer circuit. The second signal may be generated as a weighted combination of the input signal and the one or more phase-shifted versions of the input signal. The first output provided by the phase measurement circuit may be configured to adjust weights applied to the input signal and the one or more phase-shifted versions of the input signal. The second output provided by the phase measurement circuit may be configured to decrease the delay applied by the delay circuit to the first signal when the phase difference measured between the first signal and the second signal is less than a nominal phase difference. The second output provided by the phase measurement circuit may be configured to increase the delay applied by the delay circuit to the first signal when the phase difference measured between the first signal and the second signal exceeds the nominal phase difference. In some examples, the nominal phase difference corresponds to a 90-degree phase shift. In other examples, the nominal phase difference is defined based on the structure of an eye opening in a plot of a data signal transmitted over the data communication link.

In certain examples, the phase measurement circuit is configured to modify its second output responsive to changes in a phase difference between the first signal and the second signal caused by process, voltage or temperature variations. In certain examples, the delay circuit is further configured to output a complement of the first signal, and the phase selection circuit is further configured to output a complement of the second signal.

Figure 9:
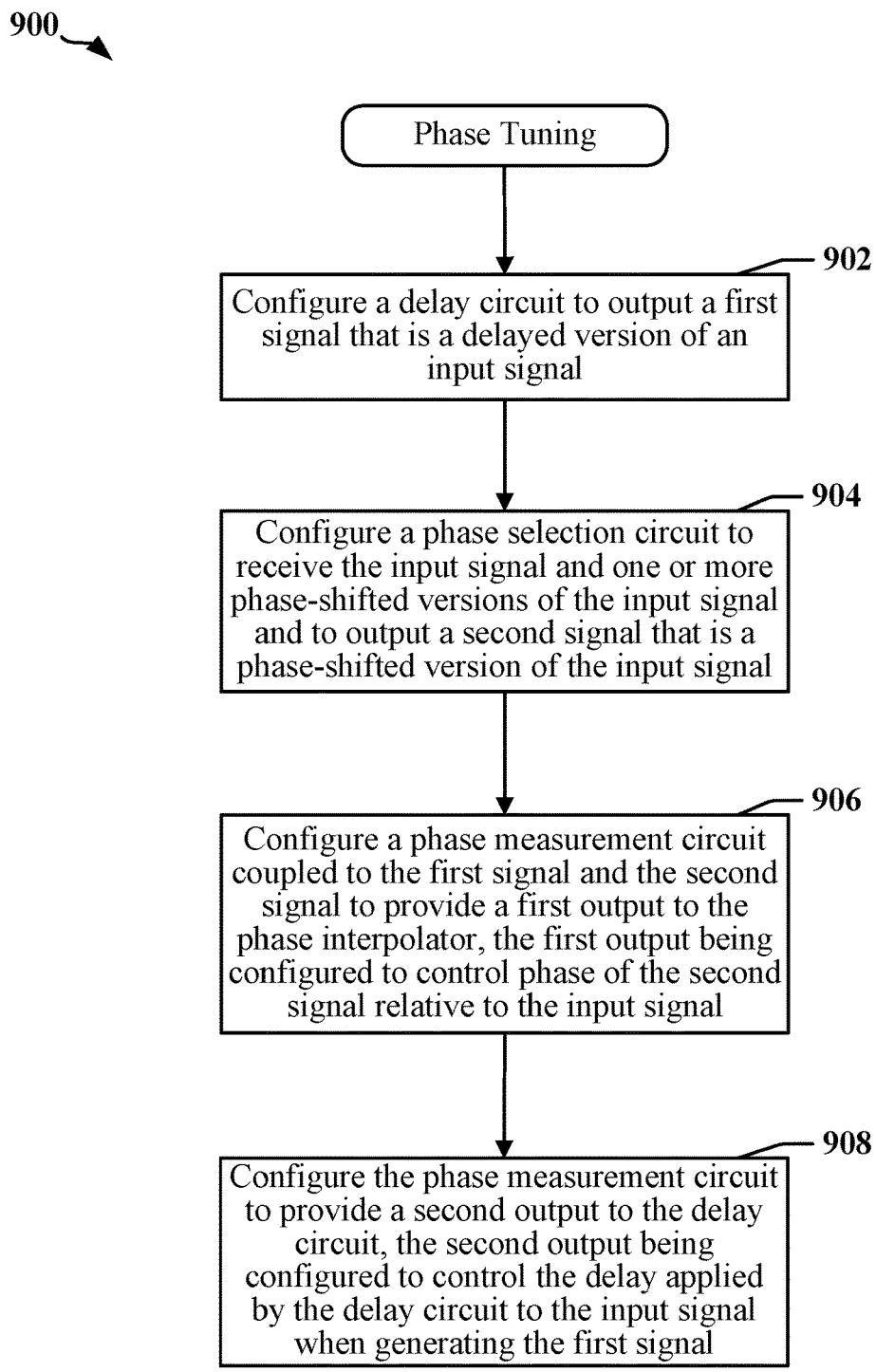
FIG. 9 is a flowchart illustrating an example of a method for tuning phase in a clock generation apparatus.

FIG. 9 is a flowchart 900 illustrating an example of a method for tuning phase in a clock generation apparatus. The method may be implemented in a receiver coupled to data communication link. In one example, the receiver may include the self-calibrated phase tuning system 600 illustrated in FIG. 6. At block 902, a delay circuit may be configured to output a first signal that is a delayed version of an input signal. At block 904, a phase selection circuit may be configured to receive the input signal and one or more phase-shifted versions of the input signal. The phase selection circuit may be further configured to output a second signal that is a phase-shifted version of the input signal. At block 906, a phase measurement circuit coupled to the first signal and the second signal may be configured to provide a first output to the phase selection circuit. The first output may be configured or operative to control phase of the second signal relative to the input signal. At block 908, the phase measurement circuit may be further configured to provide a second output to the delay circuit. The second output may be configured or operative to control the delay applied by the delay circuit to the input signal when generating the first signal.

In certain examples, the phase measurement circuit may be used to measure a phase difference between the first signal and the second signal. In one example, the phase selection circuit includes a phase interpolator circuit. In another example, the phase selection circuit includes a phase mixer circuit. The method may include generating the second signal as a weighted combination of the input signal and the one or more phase-shifted versions of the input signal. The first output provided by the phase measurement circuit may be configured or operative to adjust weights applied to the input signal and the one or more phase-shifted versions of the input signal. The second output provided by the phase measurement circuit may be configured to decrease the delay applied by the delay circuit to the first signal when the phase difference measured between the first signal and the second signal is less than a nominal phase difference. The second output provided by the phase measurement circuit may be configured to increase the delay applied by the delay circuit to the first signal when the phase difference measured between the first signal and the second signal exceeds a nominal phase difference. In some examples, the nominal phase difference corresponds to a 90-degree phase shift. In other examples, the nominal phase difference is defined based on the structure of an eye opening in a plot of a data signal transmitted over the data communication link.

In some examples, the method includes configuring the phase measurement circuit to modify its second output responsive to changes in a phase difference between the first signal and the second signal caused by PVT variations. In some examples, the method includes configuring the delay circuit to output a complement of the first signal, and configuring the phase selection circuit to output a complement of the second signal.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

In one example aspects, an apparatus includes means for delaying an input signal to provide a first signal that is a delayed version of the input signal, means for phase-shifting the input signal, and means for measuring phase differences between signals. The means for phase-shifting the input signal may be configured to provide a second signal that is a phase-shifted version of the input signal. The means for phase-shifting the input signal may be further configured to receive the input signal and one or more phase-shifted versions of the input signal and to output a second signal that is a phase-shifted version of the input signal. The means for phase-shifting the input signal may be configured to provide a first output that is provided to the means for phase-shifting the input signal. The first output may be configured to control phase of the second signal relative to the input signal. The means for phase-shifting the input signal may be further configured to provide a second output that controls the delay applied by the means for delaying the input signal to the input signal when generating the first signal.

In certain examples, the means for measuring phase differences between signals includes a phase measurement circuit coupled to the first signal and the second signal. In one example, the means for phase-shifting the input signal includes a phase interpolation circuit. In one example, the means for phase-shifting the input signal includes a phase mixer circuit. The second signal may be generated as a weighted combination of the input signal and the one or more phase-shifted versions of the input signal. The first output provided by the phase measurement circuit may be configured to adjust the weights applied to the input signal and the one or more phase-shifted versions of the input signal. The second output provided by the phase measurement circuit may be configured to decrease the delay applied by the means for delaying the input signal to the first signal when the phase difference measured between the first signal and the second signal is less than a nominal phase difference. The second output provided by the phase measurement circuit may be configured to increase the delay applied by the means for delaying the input signal to the first signal when the phase difference measured between the first signal and the second signal exceeds a nominal phase difference. In some examples, the nominal phase difference corresponds to a 90-degree phase shift. In other examples, the nominal phase difference is defined based on the structure of an eye opening in a plot of a data signal transmitted over the data communication link.

In some examples, the means for measuring phase differences between signals is configured to modify its second output responsive to changes in a phase difference between the first signal and the second signal caused by PVT variations. In some examples, the means for delaying the input signal is further configured to output a complement of the first signal and the means for phase-shifting the input signal may be further configured to output a complement of the second signal.

Some implementation examples are described in the following numbered clauses:

1. A clock generation apparatus comprising: a delay circuit configured to output a first signal that is a delayed version of an input signal; a phase selection circuit configured to receive the input signal and one or more phase-shifted versions of the input signal and to output a second signal that is a phase-shifted version of the input signal; and a phase measurement circuit coupled to the first signal and the second signal, the phase measurement circuit providing a first output that is coupled to a phase control input of the phase selection circuit, the phase measurement circuit further providing a second output that is coupled to a delay control input of the delay circuit.

2. The clock generation apparatus as described in clause 1, wherein the phase measurement circuit is configured to measure a phase difference between the first signal and the second signal.

3. The clock generation apparatus as described in clause 2, wherein the phase selection circuit comprises at least one of a phase interpolator circuit and a phase mixer circuit.

4. The clock generation apparatus as described in clause 1 or clause 2, wherein the second signal is generated as a weighted combination of the input signal and the one or more phase-shifted versions of the input signal, and wherein the first output provided by the phase measurement circuit is configured to adjust weights applied to the input signal and the one or more phase-shifted versions of the input signal.

5. The clock generation apparatus as described in any of clauses 2-4, wherein the delay control input of the delay circuit controls a delay applied by the delay circuit to the input signal to generate the first signal, and wherein the second output provided by the phase measurement circuit is configured to decrease the delay applied by the delay circuit to the first signal when the phase difference measured between the first signal and the second signal is less than a nominal phase difference.

6. The clock generation apparatus as described in clause 5, wherein the nominal phase difference corresponds to a 90-degree phase shift.

7. The clock generation apparatus as described in any of clauses 2-6, wherein the delay control input of the delay circuit controls a delay applied by the delay circuit to the input signal to generate the first signal, and wherein the second output provided by the phase measurement circuit is configured to increase the delay applied by the delay circuit to the first signal when the phase difference measured between the first signal and the second signal exceeds a nominal phase difference.

8. The clock generation apparatus of claim 7, wherein the nominal phase difference corresponds to a 90-degree phase shift.

9. The clock generation apparatus as described in any of clauses 1-8, wherein the phase measurement circuit is configured to modify its second output responsive to changes in a phase difference between the first signal and the second signal.

10. The clock generation apparatus as described in any of clauses 1-9, wherein the delay circuit is further configured to output a complement of the first signal, and wherein the phase selection circuit is further configured to output a complement of the second signal.

11. An apparatus comprising: means for delaying an input signal to provide a first signal that is a delayed version of the input signal; means for phase-shifting the input signal, configured to provide a second signal that is a phase-shifted version of the input signal, the means for phase-shifting the input signal being further configured to receive the input signal and one or more phase-shifted versions of the input signal and to output a second signal that is a phase-shifted version of the input signal; and means for measuring phase differences between signals, configured to provide a first output that is provided to the means for phase-shifting the input signal and configured to control phase of the second signal relative to the input signal, and to provide a second output that controls a delay applied by the means for delaying the input signal to the input signal when generating the first signal.

12. The apparatus as described in clause 11, wherein the means for measuring phase differences between signals comprises a phase measurement circuit coupled to the first signal and the second signal.

13. The apparatus as described in clause 12, wherein the means for phase-shifting the input signal comprises at least one of a phase interpolator circuit and a phase mixer circuit.

14. The apparatus as described in clause 12 or clause 13, wherein the second signal is generated as a weighted combination of the input signal and the one or more phase-shifted versions of the input signal, and wherein the first output provided by the phase measurement circuit is configured to adjust weights applied to the input signal and the one or more phase-shifted versions of the input signal.

15. The apparatus as described in any of clauses 12-14, wherein the delay control input of the delay circuit controls a delay applied by the delay circuit to the input signal to generate the first signal, and wherein the second output provided by the phase measurement circuit is configured to decrease the delay applied by the means for delaying the input signal to the first signal when a phase difference measured between the first signal and the second signal is less than a nominal phase difference.

16. The apparatus as described in clause 15, wherein the nominal phase difference corresponds to a 90-degree phase shift.

17. The apparatus as described in any of clauses 12-16, wherein the delay control input of the delay circuit controls a delay applied by the delay circuit to the input signal to generate the first signal, and wherein the second output provided by the phase measurement circuit is configured to increase the delay applied by the means for delaying the input signal to the first signal when a phase difference measured between the first signal and the second signal exceeds a nominal phase difference.

18. The apparatus as described in clause 17, wherein the nominal phase difference corresponds to a 90-degree phase shift.

19. The apparatus as described in any of clauses 11-18, wherein the means for measuring phase differences between signals is configured to modify its second output responsive to changes in a phase difference between the first signal and the second signal.

20. The apparatus as described in any of clauses 11-19, wherein the means for delaying the input signal is further configured to output a complement of the first signal, and wherein the means for phase-shifting the input signal is further configured to output a complement of the second signal.

21. A method for tuning phase in a clock generation apparatus, comprising: configuring a delay circuit to output a first signal that is a delayed version of an input signal; configuring a phase selection circuit to receive the input signal and one or more phase-shifted versions of the input signal and to output a second signal that is a phase-shifted version of the input signal; configuring a phase measurement circuit coupled to the first signal and the second signal to provide a first output to the phase selection circuit, the first output being configured to control phase of the second signal relative to the input signal; and configuring the phase measurement circuit to provide a second output to the delay circuit, the second output being configured to control a delay applied by the delay circuit to the input signal when generating the first signal.

22. The method as described in clause 21, further comprising: using the phase measurement circuit to measure a phase difference between the first signal and the second signal.

23. The method as described in clause 22, wherein the phase selection circuit comprises at least one of a phase interpolator circuit and a phase mixer circuit.

24. The method as described in clause 22 or clause 23, further comprising: generating the second signal as a weighted combination of the input signal and the one or more phase-shifted versions of the input signal; and configuring the first output provided by the phase measurement circuit to adjust weights applied to the input signal and the one or more phase-shifted versions of the input signal.

25. The method as described in any of clauses 22-24, further comprising: configuring the second output provided by the phase measurement circuit to decrease the delay applied by the delay circuit to the first signal when the phase difference measured between the first signal and the second signal is less than a nominal phase difference.

26. The method as described in clause 25, wherein the nominal phase difference corresponds to a 90-degree phase shift.

27. The method as described in any of clauses 22-26, further comprising: configuring the second output provided by the phase measurement circuit to increase the delay applied by the delay circuit to the first signal when the phase difference measured between the first signal and the second signal exceeds a nominal phase difference.

28. The method as described in clause 27, wherein the nominal phase difference corresponds to a 90-degree phase shift.

29. The method as described in any of clauses 21-28, further comprising: configuring the phase measurement circuit to modify its second output responsive to changes in a phase difference between the first signal and the second signal.

30. The method as described in any of clauses 21-29, further comprising: configuring the delay circuit to output a complement of the first signal; and configuring the phase selection circuit to output a complement of the second signal.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A clock generation apparatus comprising:
    a delay circuit configured to output a first signal that is a delayed version of an input signal;
    a phase selection circuit configured to receive the input signal and one or more phase-shifted versions of the input signal and to output a second signal that is a phase-shifted version of the input signal; and
    a phase measurement circuit coupled to the first signal and the second signal, the phase measurement circuit providing a first output that is coupled to a phase control input of the phase selection circuit, the phase measurement circuit further providing a second output that is coupled to a delay control input of the delay circuit.

2. The clock generation apparatus of claim 1, wherein the phase measurement circuit is configured to measure a phase difference between the first signal and the second signal.

3. The clock generation apparatus of claim 2, wherein the phase selection circuit comprises at least one of a phase interpolator circuit and a phase mixer circuit.

4. The clock generation apparatus of claim 2, wherein the second signal is generated as a weighted combination of the input signal and the one or more phase-shifted versions of the input signal, and wherein the first output provided by the phase measurement circuit is configured to adjust weights applied to the input signal and the one or more phase-shifted versions of the input signal.

5. The clock generation apparatus of claim 2, wherein the delay control input of the delay circuit controls a delay applied by the delay circuit to the input signal to generate the first signal, and wherein the second output provided by the phase measurement circuit is configured to decrease the delay applied by the delay circuit to the first signal when the phase difference measured between the first signal and the second signal is less than a nominal phase difference.

6. The clock generation apparatus of claim 5, wherein the nominal phase difference corresponds to a 90-degree phase shift.

7. The clock generation apparatus of claim 2, wherein the delay control input of the delay circuit controls a delay applied by the delay circuit to the input signal to generate the first signal, and wherein the second output provided by the phase measurement circuit is configured to increase the delay applied by the delay circuit to the first signal when the phase difference measured between the first signal and the second signal exceeds a nominal phase difference.

8. The clock generation apparatus of claim 7, wherein the nominal phase difference corresponds to a 90-degree phase shift.

9. The clock generation apparatus of claim 1, wherein the phase measurement circuit is configured to modify its second output responsive to changes in a phase difference between the first signal and the second signal.

10. The clock generation apparatus of claim 1, wherein the delay circuit is further configured to output a complement of the first signal, and wherein the phase selection circuit is further configured to output a complement of the second signal.

11. An apparatus comprising:
    means for delaying an input signal to provide a first signal that is a delayed version of the input signal;
    means for phase-shifting the input signal, configured to provide a second signal that is a phase-shifted version of the input signal, the means for phase-shifting the input signal being further configured to receive the input signal and one or more phase-shifted versions of the input signal and to output a second signal that is a phase-shifted version of the input signal; and
    means for measuring phase differences between signals, configured to provide a first output that is provided to the means for phase-shifting the input signal and configured to control phase of the second signal relative to the input signal, and to provide a second output that controls a delay applied by the means for delaying the input signal to the input signal when generating the first signal.

12. The apparatus of claim 11, wherein the means for measuring phase differences between signals comprises a phase measurement circuit coupled to the first signal and the second signal.

13. The apparatus of claim 12, wherein the means for phase-shifting the input signal comprises at least one of a phase interpolator circuit and a phase mixer circuit.

14. The apparatus of claim 12, wherein the second signal is generated as a weighted combination of the input signal and the one or more phase-shifted versions of the input signal, and wherein the first output provided by the phase measurement circuit is configured to adjust weights applied to the input signal and the one or more phase-shifted versions of the input signal.

15. The apparatus of claim 12, wherein the second output provided by the phase measurement circuit is configured to decrease the delay applied by the means for delaying the input signal to the first signal when a phase difference measured between the first signal and the second signal is less than a nominal phase difference.

16. The apparatus of claim 15, wherein the nominal phase difference corresponds to a 90-degree phase shift.

17. The apparatus of claim 12, wherein the second output provided by the phase measurement circuit is configured to increase the delay applied by the means for delaying the input signal to the first signal when a phase difference measured between the first signal and the second signal exceeds a nominal phase difference.

18. The apparatus of claim 17, wherein the nominal phase difference corresponds to a 90-degree phase shift.

19. The apparatus of claim 11, wherein the means for measuring phase differences between signals is configured to modify its second output responsive to changes in a phase difference between the first signal and the second signal.

20. The apparatus of claim 11, wherein the means for delaying the input signal is further configured to output a complement of the first signal, and wherein the means for phase-shifting the input signal is further configured to output a complement of the second signal.

21. A method for tuning phase in a clock generation apparatus, comprising:
configuring a delay circuit to output a first signal that is a delayed version of an input signal;
configuring a phase selection circuit to receive the input signal and one or more phase-shifted versions of the input signal and to output a second signal that is a phase-shifted version of the input signal;
configuring a phase measurement circuit coupled to the first signal and the second signal to provide a first output to the phase selection circuit, the first output being configured to control phase of the second signal relative to the input signal; and
configuring the phase measurement circuit to provide a second output to the delay circuit, the second output being configured to control a delay applied by the delay circuit to the input signal when generating the first signal.

22. The method of claim 21, further comprising:
using the phase measurement circuit to measure a phase difference between the first signal and the second signal.

23. The method of claim 22, wherein the phase selection circuit comprises at least one of a phase interpolator circuit and a phase mixer circuit.

24. The method of claim 22, further comprising:
generating the second signal as a weighted combination of the input signal and the one or more phase-shifted versions of the input signal; and
configuring the first output provided by the phase measurement circuit to adjust weights applied to the input signal and the one or more phase-shifted versions of the input signal.

25. The method of claim 22, further comprising:
configuring the second output provided by the phase measurement circuit to decrease the delay applied by the delay circuit to the first signal when the phase difference measured between the first signal and the second signal is less than a nominal phase difference.

26. The method of claim 25, wherein the nominal phase difference corresponds to a 90-degree phase shift.

27. The method of claim 22, further comprising:
configuring the second output provided by the phase measurement circuit to increase the delay applied by the delay circuit to the first signal when the phase difference measured between the first signal and the second signal exceeds a nominal phase difference.

28. The method of claim 27, wherein the nominal phase difference corresponds to a 90-degree phase shift.

29. The method of claim 21, further comprising:
configuring the phase measurement circuit to modify its second output responsive to changes in a phase difference between the first signal and the second signal.

30. The method of claim 21, further comprising:
configuring the delay circuit to output a complement of the first signal; and
configuring the phase selection circuit to output a complement of the second signal.

\* \* \* \* \*